(12) United States Patent
Chung et al.

(10) Patent No.: US 6,498,399 B2
(45) Date of Patent: *Dec. 24, 2002

(54) LOW DIELECTRIC-CONSTANT DIELECTRIC FOR ETCHSTOP IN DUAL DAMASCENE BACKEND OF INTEGRATED CIRCUITS

(75) Inventors: Henry Chung, Cupertino, CA (US); James Lin, Chu-Pei (TW)

(73) Assignee: AlliedSignal Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,721

(22) Filed: Sep. 8, 1999

(65) Prior Publication Data

US 2002/0142577 A1 Oct. 3, 2002

(51) Int. Cl.[7] .................... H01L 23/485; H01L 21/4763
(52) U.S. Cl. ...................................... 257/774; 438/638
(58) Field of Search .......................... 257/40, 642, 759, 257/774; 438/618, 627, 623, 702, 706, 634, 648, 638, 674

(56) References Cited

U.S. PATENT DOCUMENTS

| | | | | |
|---|---|---|---|---|
| 5,482,894 A | * | 1/1996 | Havemann | 438/623 |
| 5,565,384 A | * | 10/1996 | Havemann | 438/702 |
| 5,801,094 A | | 9/1998 | Yew et al. | 438/624 |
| 5,920,790 A | * | 7/1999 | Wetzel et al. | 438/618 |
| 6,001,730 A | * | 12/1999 | Farkas et al. | 438/627 |
| 6,004,883 A | * | 12/1999 | Yu et al. | 438/706 |
| 6,071,809 A | * | 6/2000 | Zhao | 438/634 |
| 6,097,095 A | * | 8/2000 | Chung | 257/774 |
| 6,100,184 A | * | 8/2000 | Zhao et al. | 438/638 |

OTHER PUBLICATIONS

"High Stud–to–Line Contact Area in Damascene Metal Processing"; IBM Technical Disclosure Bulletin, vol. 33, No. IA, Jun. 1990.

* cited by examiner

Primary Examiner—Wael Fahmy
Assistant Examiner—William David Coleman
(74) Attorney, Agent, or Firm—Roberts & Mercanti, LLP

(57) ABSTRACT

The invention provides microelectronic devices such as integrated circuit devices. Such have vias, interconnect metallization and wiring lines using dissimilar low dielectric constant intermetal dielectrics. The use of both organic and inorganic low-k dielectrics offers advantages due to the significantly different plasma etch characteristics of the two kinds of dielectrics. One dielectric serves as the etchstop in etching the other dielectric so that no additional etchstop layer is required. A microelectronic device is formed having a substrate and a layer of a first dielectric material positioned on the substrate. A layer of a second dielectric material is positioned on the first dielectric layer and an additional layer of the first dielectric material positioned on the second dielectric material. At least one via extends through the first dielectric material layer and the second dielectric material layer, and at least one trench extends through the additional layer of the first dielectric material to the via. A lining of a barrier metal is formed on inside walls and a floor of the trench and on inside walls and a floor the via. A fill metal fills the trench and via in contact with the lining of the barrier metal.

24 Claims, 15 Drawing Sheets

Step 1 Inorganic low-k dielectric deposition
Step 2 Organic low-k dielectric deposition
Step 3 Inorganic low-k dielectric deposition
Step 4 Resist spin and bake
Step 5 Via mask and resist development Step 6  Inorganic low-k dielectric etch
Step 7  Organic low-k dielectric etch
Step 8  Inorganic low-k dielectric etch Step 9  Resist removal
Step 10 Resist spin and bake
Step 11 Trench mask and resist development Step 12 Inorganic low-k dielectric etch Step 13 Organic low-k dielectric etch and resist removal Step 1  Inorganic low-k dielectric deposition
Step 2  Resist spin and bake
Step 3  Via mask and resist development
Step 4  Inorganic low-k dielectric etch Step 5  Resist removal
Step 6  Organic low-k dielectric deposition
Step 7  Inorganic low-k dielectric deposition
Step 8  Resist spin and bake
Step 9  Metal trench mask and resist development Step 10  Inorganic low-k dielectric etch Step 11  Organic low-k dielectric etch and resist removal Step 1 Inorganic low-k dielectric deposition
Step 2 Organic low-k dielectric deposition
Step 3 Inorganic low-k dielectric deposition
Step 4 Resist spin and bake
Step 5 Metal trench mask and resist development Step 6 Inorganic low-k dielectric etch Step 7 Organic low-k dielectric etch and resist removal
Step 8 Resist spin and bake
Step 9 Via mask and resist development Step 10 Inorganic low-k dielectric etch
Step 11 Organic low-k dielectric etch
Step 12 Inorganic low-k dielectric etch Step 13 Resist removal

LOW DIELECTRIC-CONSTANT DIELECTRIC FOR ETCHSTOP IN DUAL DAMASCENE BACKEND OF INTEGRATED CIRCUITS

BACKGROUND OF THE INVENTION

1. Field of the Invention

The invention pertains to the formation of microelectronic devices such as integrated circuit devices. More particularly, the invention relates to the formation of vias and trenches, or interconnect metallization and wiring lines using multiple low dielectric constant intermetal dielectrics.

2. Description of the Related Art

In the production of microelectronic devices, the levels of multilevel wiring structures have interconnecting regions for interconnecting one or more devices within overall integrated circuits. In forming such devices, it is conventional to form lower level wiring lines, then an interlevel dielectric layer and then to form upper level wiring lines. One or more metal filled vias are typically formed in the interlevel dielectric to connect the upper and lower level wiring lines.

One conventional method for forming a two level wiring structure is to first form a two level interconnect structure over a substrate. The surface of a substrate may be the surface of a silicon device structure or the surface of substrate may be an insulating layer. An oxide layer is typically deposited over the substrate by chemical vapor deposition. The first, level interconnect structures are defined by a conventional photolithography process which forms openings through the oxide layer where the first level interconnects will be formed. Generally, the openings expose portions of conductors in the substrate to which interconnects are formed. The openings are filled with a metal interconnect to form the interconnect and form a metal plug. Then a layer of metal such as aluminum is deposited over the surface of the oxide layer and over the metal plug to a thickness appropriate for second level wiring lines. The metal layer is then patterned into the second level wiring lines. The second level wiring lines are defined in a conventional photolithography process by providing a layer of photoresist over the metal layer, exposing the photoresist through a mask and removing portions of the exposed photoresist layer to form a photoresist etch mask. The portions of the metal layer exposed by openings in the photoresist mask are then removed by etching and the photoresist mask is removed by ashing. After the two level interconnect structure is formed,it is necessary to provide an intermetal dielectric (IMD) layer between the second level wiring lines and covering the second level wiring lines to accommodate further processing of the integrated circuit device. In the past, the intermetal dielectric layer might consist of one or more layers of oxide deposited by plasma enhanced chemical vapor deposition or other processes.

Prior art integrated circuits produced by single or dual damascene processes with Cu interconnects and low dielectric-constant (k) intermetal dielectrics have used only one kind of low-k dielectric, either inorganic, organic or a hybrid of these two kinds. This conventional approach of using the same kind of low-k dielectric for both metal-level and via-level IMD's has limited process integration and implementation options. As a result, additional processing steps and added cost are required. This conventional approach of using the same kind of low-k dielectric for both metal-level and via-level IMD's also requires an etchstop, usually silicon nitride, between the metal-level and via-level inter-metal dielectrics, IMD's. The use of silicon nitride, which has a high dielectric constant of 7, seriously degrades the speed performance of integrated circuits. It is desirable whenever possible to reduce the number of processing steps required to form a device because reducing the number of processing steps shortens the time required to produce the device and because eliminating processing steps improves yields and so reduces costs.

The present invention uses two dissimilar low-k dielectrics for the intermetal dielectrics of Cu-based dual damascene backends of integrated circuits. The use of both organic and inorganic low-k dielectrics offers several advantages due to the significantly different plasma etch characteristics of these two kinds of dielectrics. One dielectric serves as an etchstop in etching the other dielectric. No additional oxide or nitride etchstop layer is required. High performance is achieved due to the lower parasitic capacitance resulting from the use of low-k dielectrics. This invention takes the advantage that inorganic and organic dielectric are significantly in their plasma etch characteristics. Either can be made the etchstop in plasma etching the other one. It is apparent that in the conventional approach having the same kind of dielectric for both via-level and metal-level IMD's, that additional thin films need be deposited to establish the existence of etchstop in the conventional architecture. In oxygen-based plasmas, organic dielectrics etch tremendously faster than inorganic dielectrics. Inversely, in carbon fluoride based plasmas, inorganic dielectrics etch significantly faster than organic dielectrics.

SUMMARY OF THE INVENTION

The invention provides a microelectronic device which comprises (a) a substrate;

(b) a layer of a first dielectric material positioned on the substrate;

(c) a layer of a second dielectric material positioned on the first dielectric layer; wherein the first dielectric material and the second dielectric material have substantially different etch resistance properties;

(d) an additional layer of the first dielectric material positioned on the second dielectric material, (e) at least one via extending through the first dielectric material layer and the second dielectric material layer, and at least one trench through the additional layer of the first dielectric material extending to at least one via;

(f) a lining of a barrier metal on inside walls and a floor of the trench and on inside walls and a floor of the via;

(g) a fill metal filling the trench and via in contact with the lining of the barrier metal.

The invention also provides a process for producing a microelectronic device which comprises:

(a) forming a first dielectric layer on a substrate;

(b) forming a second dielectric layer on the first dielectric layer;

(c) forming an additional first dielectric layer on the second dielectric layer;

(d) depositing a layer of a photoresist on the additional first dielectric layer and imagewise removing a portion of the photoresist corresponding to at least one via for the first dielectric layer;

(e) sequentially removing the portions of the additional first dielectric layer, the second dielectric layer and the first dielectric layer under the removed portion of the photoresist thus forming at least one via through the first dielectric layer; and then removing the balance of the photoresist layer;

(f) depositing an additional layer of a photoresist on the additional first dielectric layer and imagewise removing a portion of the additional photoresist corresponding to at least one trench for the additional first dielectric layer;

(g) removing the portion of the additional first dielectric layer under the removed portion of the additional photoresist layer thus forming at least one trench through the additional first dielectric layer;

(h) optionally removing the portion of the second dielectric layer under the removed portion of the additional photoresist layer;

(i) removing the balance of the additional photoresist layer;

(j) lining a barrier metal on inside walls and a floor of the trench and on inside walls and a floor of the via;

(k) filling the trench and via with a fill metal in contact with the lining of the barrier metal.

The invention further provides a process for producing a microelectronic device which comprises:

(a) forming a first dielectric layer on a substrate;

(b) depositing a layer of a photoresist on the first dielectric layer and imagewise removing a portion of the photoresist corresponding to at least one via for the first dielectric layer;

(c) removing the portion of the first dielectric layer under the removed portion of the photoresist thus forming at least one via through the first dielectric layer; and then removing the balance of the photoresist layer;

(d) forming a second dielectric layer on the first dielectric layer and in the at least one via;

(e) forming an additional first dielectric layer on second dielectric layer;

(f) depositing an additional layer of a photoresist on the additional first dielectric layer and imagewise removing a portion of the additional photoresist corresponding to at least one trench for the additional first dielectric layer and the second dielectric layer;

(g) sequentially removing the portions of the additional first dielectric layer and the second dielectric layer under the removed portion of the additional photoresist layer thus forming at least one trench through the additional first dielectric layer and the second dielectric;

(h) removing the balance of the additional photoresist layer;

(i) lining a barrier metal on inside walls and a floor of the trench and on inside walls and a floor of the via;

(j) filling the trench and via with a fill metal in contact with the lining of the barrier metal.

The invention still further provides a process for producing a microelectronic device which comprises:

(a) forming a first dielectric layer on a substrate;

(b) forming a second dielectric layer on the first dielectric layer;

(c) forming an additional first dielectric layer on the second dielectric layer;

(d) depositing a layer of a photoresist on the additional first dielectric layer and imagewise removing a portion of the photoresist corresponding to at least one trench for the additional first dielectric layer and the second dielectric layer;

(e) sequentially removing the portions of the additional first dielectric layer and the second dielectric layer under the removed portion of the photoresist thus forming at least one trench through the additional first dielectric layer and the second dielectric layer; and then removing the balance of the photoresist layer;

(f) depositing an additional layer of a photoresist on the first dielectric layer and the additional first dielectric layer and imagewise removing a portion of the additional photoresist corresponding to at least one via for the first dielectric layer;

(g) removing the portion of the first dielectric layer under the removed portion of the additional photoresist layer thus forming at least one via through the first dielectric layer; optionally removing a portion of the additional first dielectric layer and the second dielectric layer under removed portions of the additional photoresist layer;

(h) removing the balance of the additional photoresist layer;

(i) lining a barrier metal on inside walls and a floor of the trench and on inside walls and a floor of the via;

(j) filling the trench and via with a fill metal in contact with the lining of the barrier metal.

DETAILED DESCRIPTION OF THE PREFERRED EMBODIMENT

Figure 1:
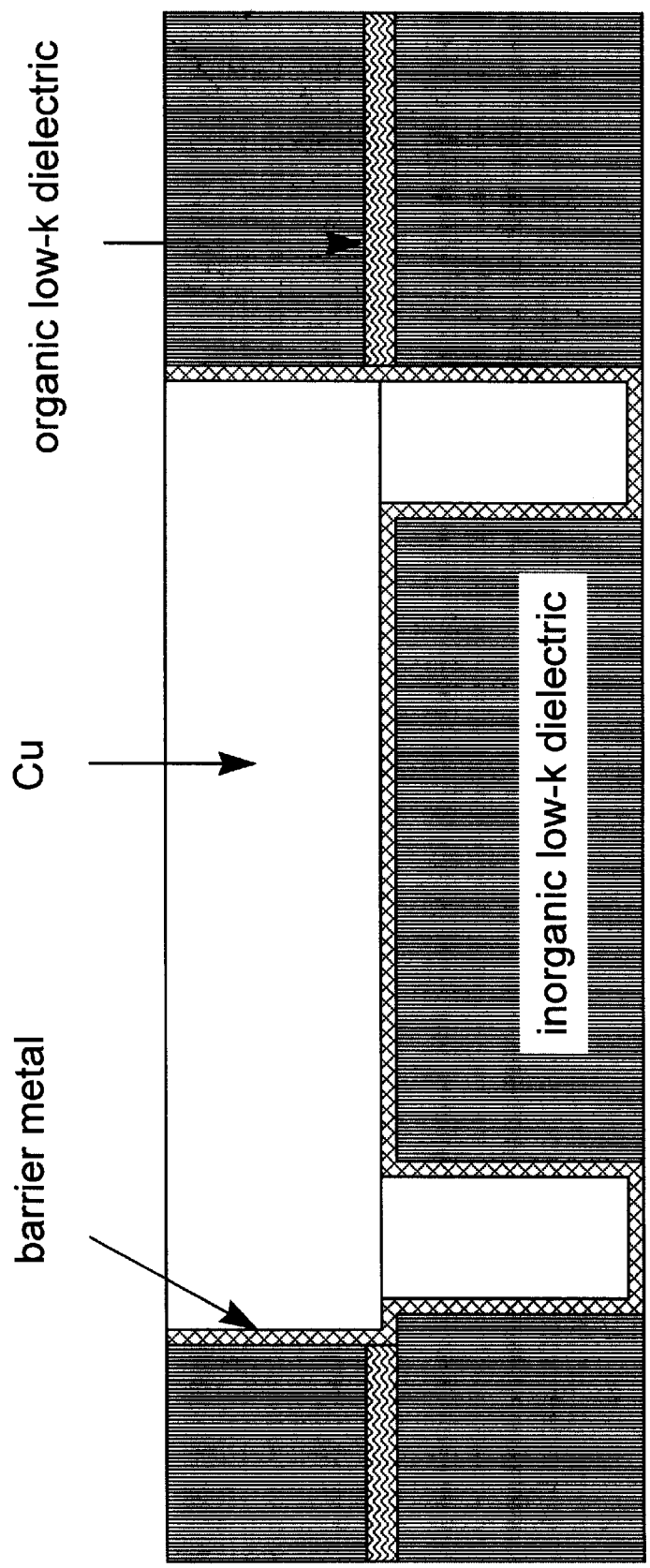
FIG. 1 shows a microelectronic device architecture according to the invention.

The integrated circuit architecture produced by a first process embodiment of the invention is show in FIG. 1. This structure uses two different kinds of low-k dielectric thin films for the ID, one dielectric is organic and the other dielectric is inorganic. Shown in FIG. 1, the architecture is the part of the backend of an integrated circuit of multi-level interconnections fabricated according to this invention. An inorganic low-k dielectric is used for via-level and metal-level IMD's and an organic low-k dielectric is used in between via-level and metal-level IMD's. The process steps used for the fabrication of the shown via-level and metal-level IMD's can be repeated again for upper levels of via-level and metal-level IMD's. The alternating organic and inorganic dielectric layers have a significant difference in etch rate. The invention takes advantage of a significant difference in plasma etch rate between organic and inorganic dielectrics. This is not available when the same dielectric is employed for both via-level and metal-level IMD's. In oxygen-based plasmas, organic dielectrics etch tremendously faster than inorganic dielectrics. Inversely, in carbon fluoride based plasmas, inorganic dielectrics etch much faster than organic dielectrics. Architecture shown in FIG. 1 has several distinct features: There is no need of an additional thin film separating two adjacent IMD's. In a conventional approach with silicon oxide for IMD, silicon nitride is commonly used as separation layer. Silicon nitride has the major disadvantage of having a very high dielectric constant of 7. Separation layers are also used as etchstop in opening borderless vias when the vias are misaligned to the underlying metal line. The presence of the separation layers can prevent the creation of deep and narrow trenches, which are a major yield and reliability concern. However, a separation layer is not required in this invention for the same reason that two dissimilar dielectrics are used and they are significantly different in their plasma etch characteristics.

The FIG. 1 architecture shows a microelectronic device which comprises a substrate and a layer of a first dielectric material positioned on the substrate. A layer of a second dielectric material is positioned on the first dielectric layer. The first dielectric material and the second dielectric material have substantially different etch resistance properties. An additional layer of the first dielectric material positioned on the second dielectric material. At least one via extends through the first dielectric material layer and the second dielectric material layer, and at least one trench extends through the additional layer of the first dielectric material extending to the via. A lining of a barrier metal is positioned on inside walls and a floor of the trench as well as on inside walls and a floor the via. Then a fill metal fills the trench and via in contact with the lining of the barrier metal.

Figure 2A:
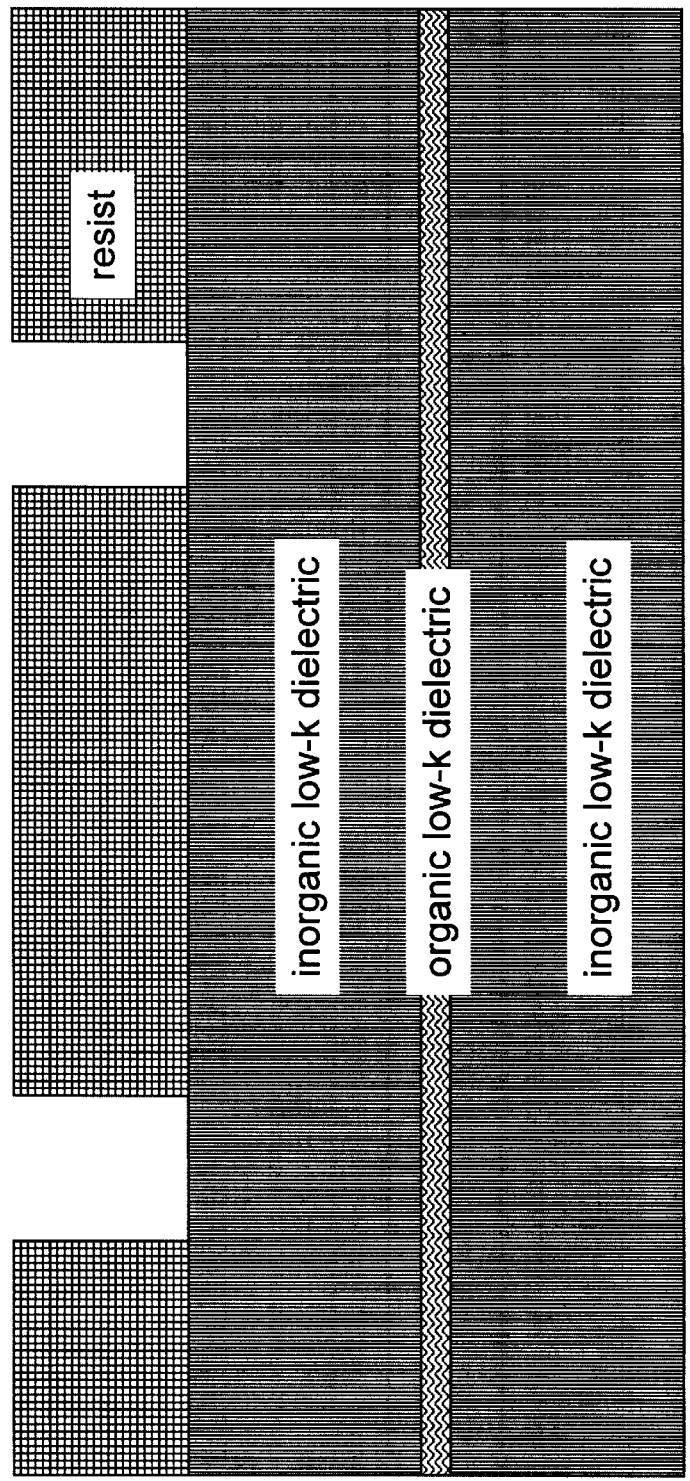
FIG. 2A shows a first microelectronic device formation process resulting after inorganic low-k dielectric deposition; organic low-k dielectric deposition; additional inorganic low-k dielectric deposition; resist spin and bake; and via mask exposure and resist development.

A first process embodiment of the invention is exemplified by FIGS. 2A through 2E. These figures show the process flow after the formation of the first via level and interconnect level, however, the same processing steps can be repeated again for upper levels of vias and interconnects. FIG. 2A shows the interim structure after step 1 which is a deposition of a first inorganic low-k dielectric, step 2 which is a deposition of a second organic low-k dielectric on the first dielectric layer, step 3 which is a deposition of an additional layer of the first dielectric material positioned on the second dielectric material. Then in step 4 one deposits and bakes a layer of a photoresist on the additional first dielectric layer and imagewise removes a portion of the photoresist corresponding to at least one via for the first dielectric layer.

The substrate may have a pattern of metal lines on its surface. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof The lines are typically formed by well known lithographic techniques. Suitable materials for the lines include aluminum, aluminum alloys, copper, copper alloys, titanium, tantalum, and tungsten. These lines form the conductors of an integrated circuit. Such are typically closely separated from one another at distances preferably of from about 20 micrometers or less, more preferably from about 1 micrometer or less, and most preferably of from about 0.05 to about 1 micrometer.

The organic and inorganic dielectric compositions may comprise any of a wide variety of dielectric forming materials which are well known in the art for use in the formation of microelectronic devices. The dielectric layers may non-exclusively include silicon containing spin-on glasses, i.e. silicon-containing polymer such as an alkoxysilane polymer, a silsesquioxane polymer, a siloxane polymer; a poly (arylene ether), a fluorinated poly(arylene ether), other polymeric dielectric materials, nanoporous silica or mixtures thereof The only criteria for this invention is that organic dielectrics are formed adjacent to inorganic dielectrics. Useful organic dielectrics are those which follow which are carbon containing and inorganics are those which follow which are not carbon containing.

One useful polymeric dielectric material useful for the invention include an nanoporous silica alkoxysilane polymer formed from an alkoxysilane monomer which has the formula:

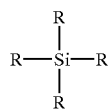

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly(arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Preferred siloxane materials suitable for use in this invention are commercially available from AlliedSignal Inc. under the tradename Accuglass® T-11, T-12 and T-14. Also useful are methylated siloxane polymers available from AlliedSignal Inc. under the tradenames Purespin™ and Accuspin® T18, T23 and T24.

Preferred silicon containing dielectric resins include polymers having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

$[H—SiO_{1.5}]_n[R—SiO_{1.5}]_m$, $[H_{0.4—1.0}SiO_{1.5-1.8}]_n[R_{0.4-1.0}—SiO_{1.5-1.8}]_m$, $[H_{0-1.0}—SiO_{1.5-2.0}]_n[R—SiO_{1.5}]_m$, $[H—SiO_{1.5}]_x[R—SiO_{1.5}]_y[SiO_2]_z$, wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain high organic content silicon containing polymers such as those having the formula II:

$[HSiO_{1.5}]_n[RSiO_{1.5}]_m$, $[H_{0.4-1.0}SiO_{1.5-1.8}]_n[R_{0.4-1.0}SiO_{1.5-1.8}]_m$, $[H_{0-1.0}SiO_{1.5-2.0}]_n[RSiO_{1.5}]_m$, wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z$, wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 86% to about 97%. Suitable solvents nonexclusively include aprotic solvents such as cyclic ketones including cyclopentanone, cyclohexanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm$^3$ to about 3 g/cm$^3$.

The dielectric layers may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The polymer layer may also optionally be exposed to actinic light, such as UV light, to increase its molecular weight. The amount of exposure may range from about 100 MJ/cm$^2$ to about 300 mJ/cm$^2$. The dielectric layers may optionally be cured by overall exposed to electron beam radiation. Electron beam exposure may be controlled by setting the beam acceleration. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 $\mu$C/cm$^2$ and more preferably from about 50 to about 20,000 $\mu$C/cm$^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Vias are formed in the dielectric layers by well known photolithographic techniques using a photoresist composition, i.e. imagewise patterning and removal of portions of the resist and sequential inorganic dielectric etch, organic dielectric etch and inorganic dielectric etch to form cavities through these layers. Such are formed in a manner well known in the art such as by coating the photoresist, imagewise exposing to actinic radiation such as through a suitable mask, developing the photoresist and etching away portions of the inorganic dielectric to form cavities. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the inorganic dielectric surface by plasma etching. Plasma generators which are capable of such etching are described in U.S. Pat. Nos. 5,174,856 and 5,200,031.

Figure 2B:
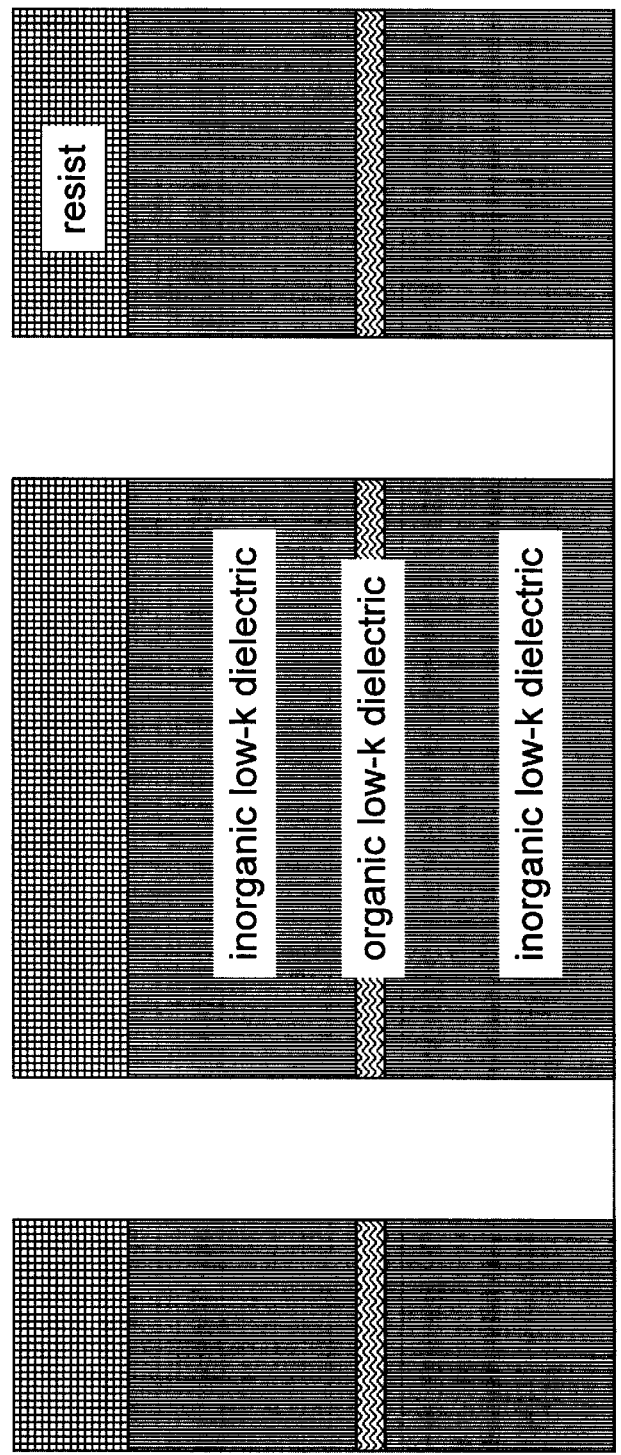
FIG. 2B shows the process result after upper level inorganic low-k dielectric etch, organic low-k dielectric etch and lower level inorganic low-k dielectric etch.

Next, as shown in FIG. 2B, in the sixth through eighth steps, one sequentially removes the portions of the additional first dielectric layer, the second dielectric layer and the first dielectric layer under the removed portion of the photoresist thus forming at least one via through the first dielectric layer. The balance of the photoresist layer is removed in step 9, however since the resist is organic, this may be done simultaneously with the removal of the second organic layer. The organic low-k dielectric is etched by an etch chemistry which does not remove the inorganic low-k dielectric and vice-versa.

Figure 2C:
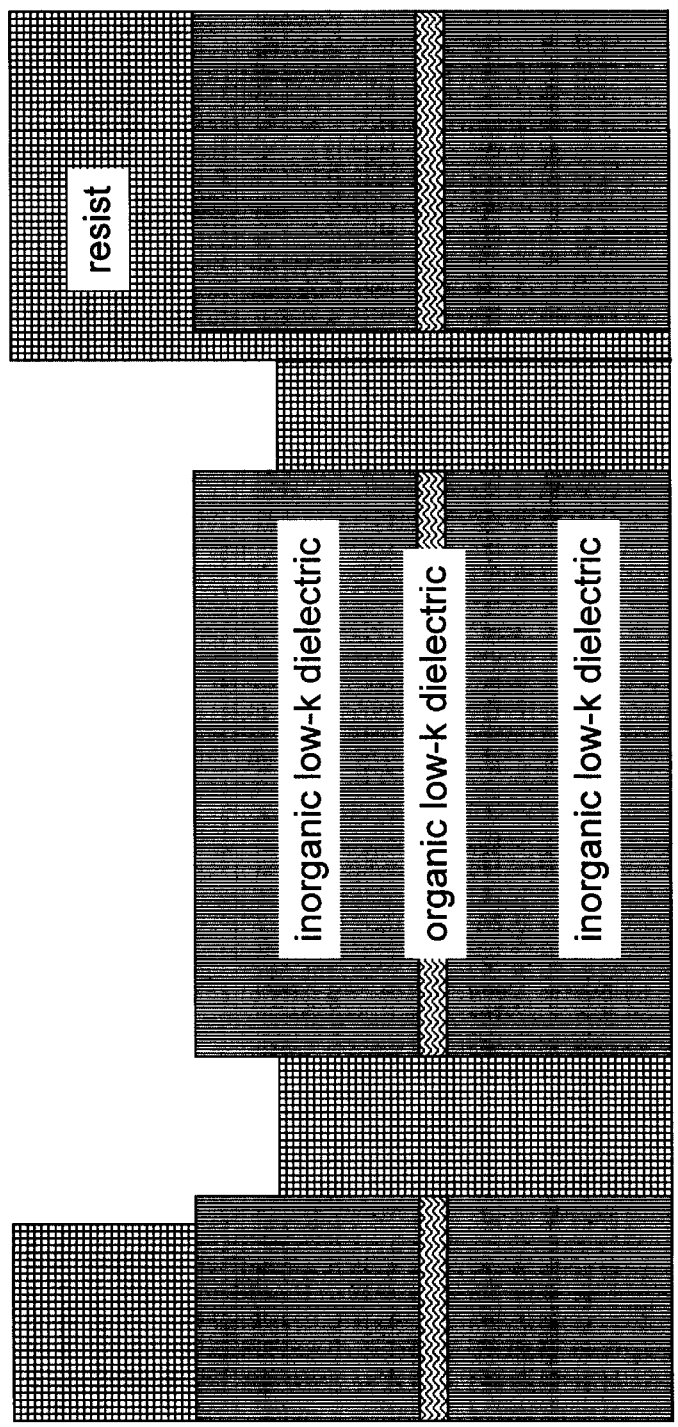
FIG. 2C shows the process result after resist removal, resist spin and bake, mask exposure and resist development.

Next, a resist application step 10 is required for metal trench patterning. Another photoresist is applied to the top of the additional inorganic dielectric layer and fills the vias in the organic dielectric layer and the inorganic dielectric layer with photoresist. FIG. 2C shows the structure after application and baking of the layer of resist material. In step 11, one imagewise exposes the resist through a metal trench mask, imagewise removes a portion of the photoresist from the top of the additional inorganic dielectric layer; and removes a portion and leaves a portion of the photoresist through a thickness of the additional inorganic dielectric layer. The result is seen in FIG. 2C.

Figure 2D:
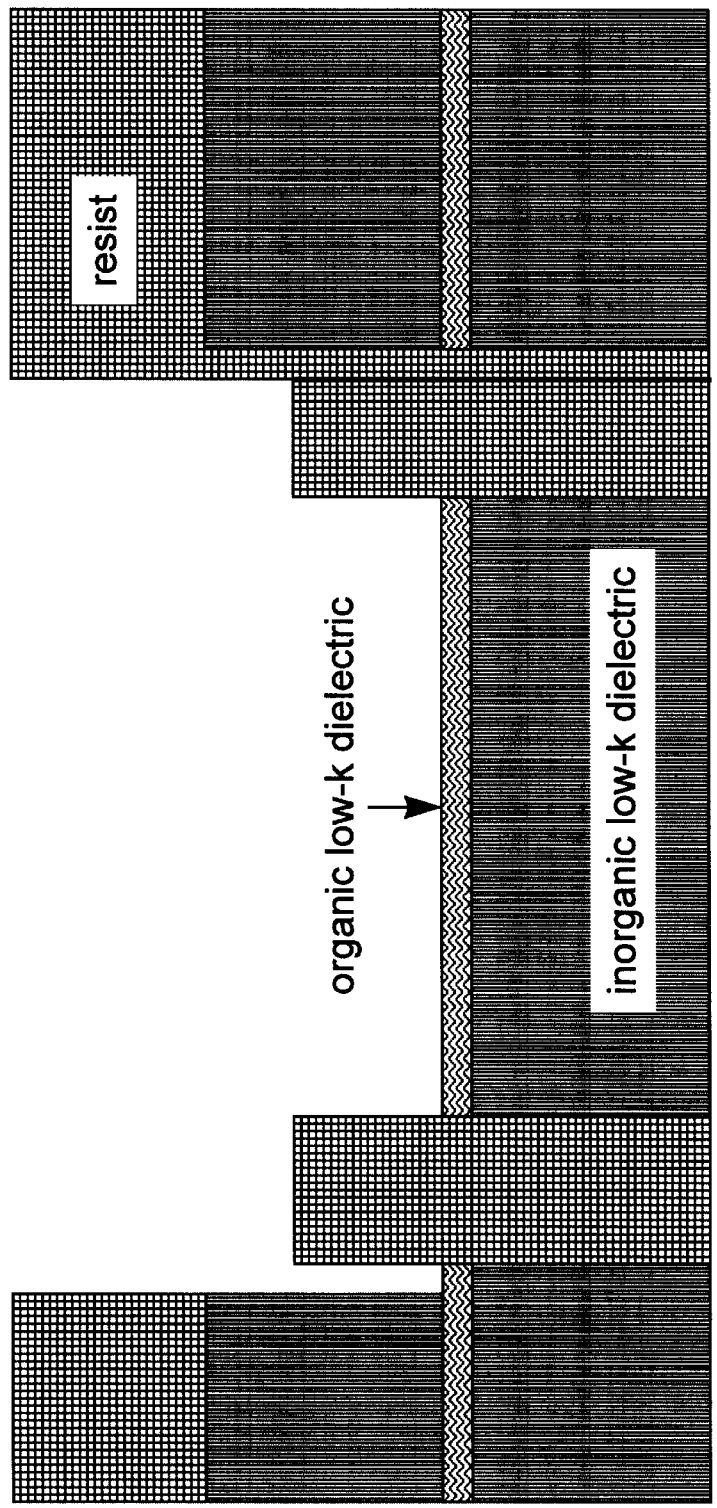
FIG. 2D shows the result after inorganic low-k dielectric etch.

Step 12 requires removing part of the inorganic dielectric layer underlying the portions of the photoresist removed from the top of the additional inorganic dielectric layer to form trenches in the additional inorganic dielectric layer. Due to chemical differences between the inorganic and organic dielectrics, the plasma etch rate of low-k organic dielectric can be made to be significantly less than the plasma etch rate of the inorganic dielectric. As a result, the etch stops once the additional inorganic dielectric on top of the organic dielectric is cleared. No etchstop is required in this approach. The result is seen in FIG. 2D.

Figure 2E:
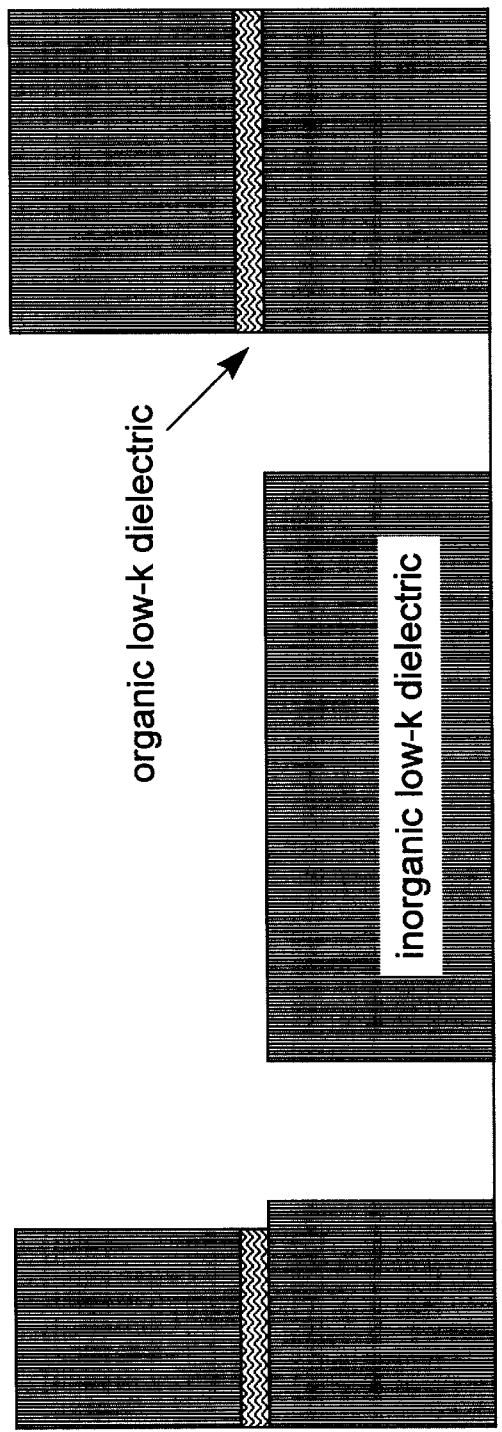
FIG. 2E shows the result after removing the balance of the photoresist from the top of the additional inorganic dielectric layer and from the vias.

The next step 13 removes the balance of the photoresist from the top of the additional inorganic dielectric layer and from the vias and the result is shown in FIG. 2E. Thereafter one lines a barrier metal on inside walls and a floor of the trench and on inside walls and a floor the via and fills the trench and via with a fill metal in contact with the lining of the barrier metal to achieve the architecture of FIG. 1. Suitable fill metals include aluminum, aluminum alloys, copper, copper alloys, tantalum, tungsten, titanium or other metals or mixtures thereof as typically employed in the formation of microelectronic devices. The metal may be applied by such techniques as vapor deposition, sputtering, evaporation and the like. Copper is most preferred. The thickness of the metal layers is preferably from about 3,000 to 15,000 Angstroms. The metal is applied by first forming a barrier metal seeding layer on the walls and floor of the vias and trenches. Then the balance of the metal is applied. As used herein, the term "a metal" includes amalgams of metals. A barrier metal serves to prevent diffusion of the conductive metal into the dielectric layers. The barrier metal may be, for example, Ti or a nitride such TaN or TiN. Copper interconnect processing is used to form a self-aligned metal barrier on the top of the copper interconnect. With a metal barrier on top, the commonly used silicon nitride barrier is not necessary. It is to be understood that these steps may be repeated to provide a series of suitable layers and conductive paths over one another on the substrate to produce the architecture of FIG. 1. The architecture shown in FIG. 1 has several distinct features. When separation layers are required, low-k dielectric films can be used with the approach taken in this invention which utilizes two dissimilar low-k dielectric films for IMD's. In a conventional approach, CVD oxide or silicon nitride is commonly used as separation layer. Both these prior inorganic dielectrics have the major disadvantage of having a high dielectric constant, 4 and 7, respectively, for silicon oxide and silicon nitride. Concerning the functions of the separation layers, heretofore a high dielectric constant material such as silicon nitride, is provided as an etchstop in opening metal trenches. In the architecture of FIG. 1, there is no need to have such an etchstop since the organic low-k dielectric used for via-level IMD etches much slower than the inorganic low-k dielectric and thus it is an etchstop by itself.

Figure 3A:
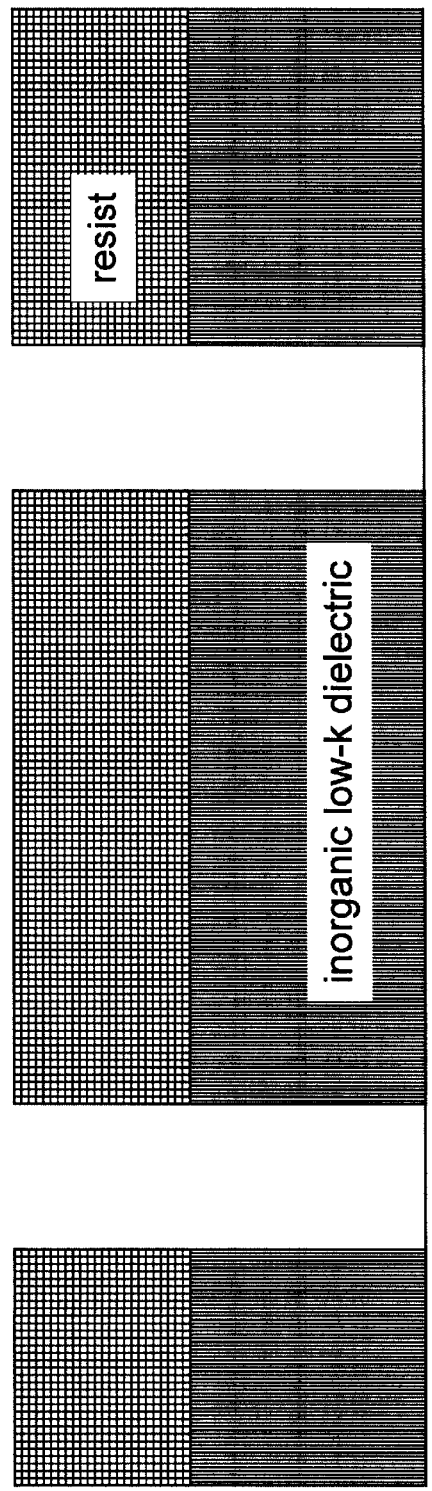
FIG. 3A shows a second microelectronic device formation process resulting after inorganic low-k dielectric deposition; resist spin and bake; via mask exposure and resist development and inorganic low-k dielectric etch.
Figure 3B:
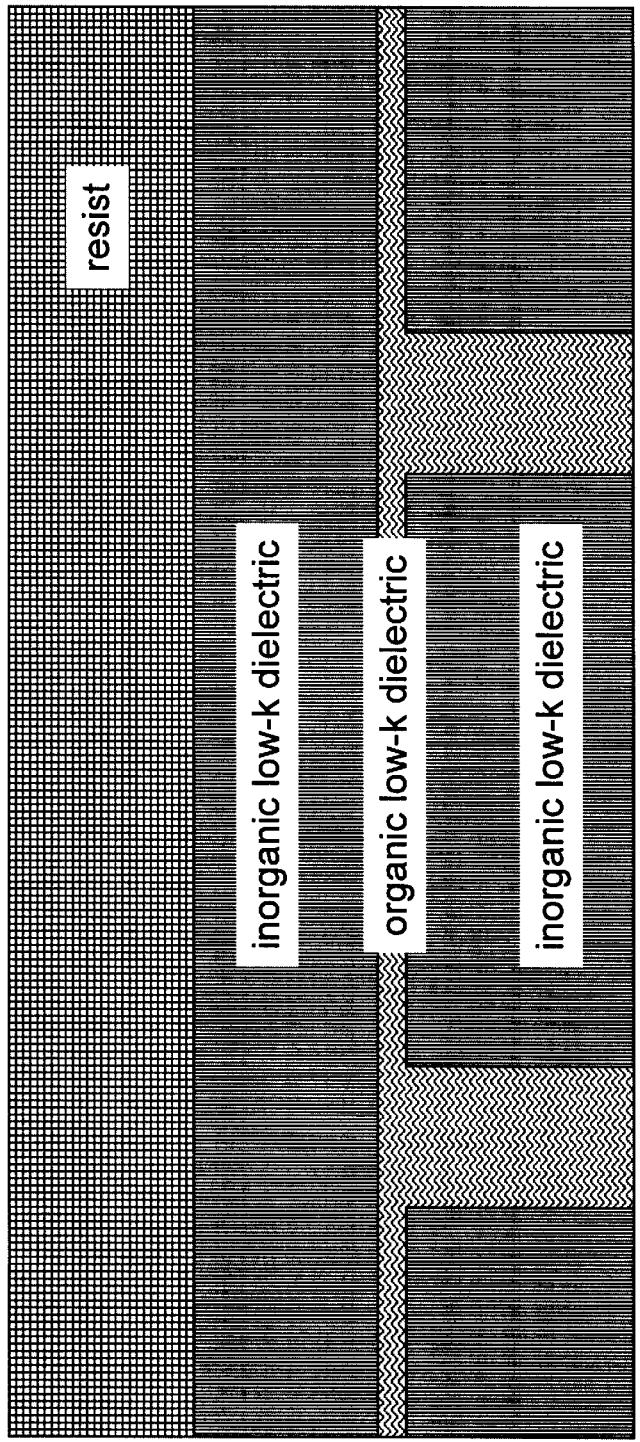
FIG. 3B shows the result after resist removal, organic low-k dielectric deposition, inorganic low-k dielectric deposition, resist spin and bake, metal trench mask exposure and resist development.
Figure 3C:
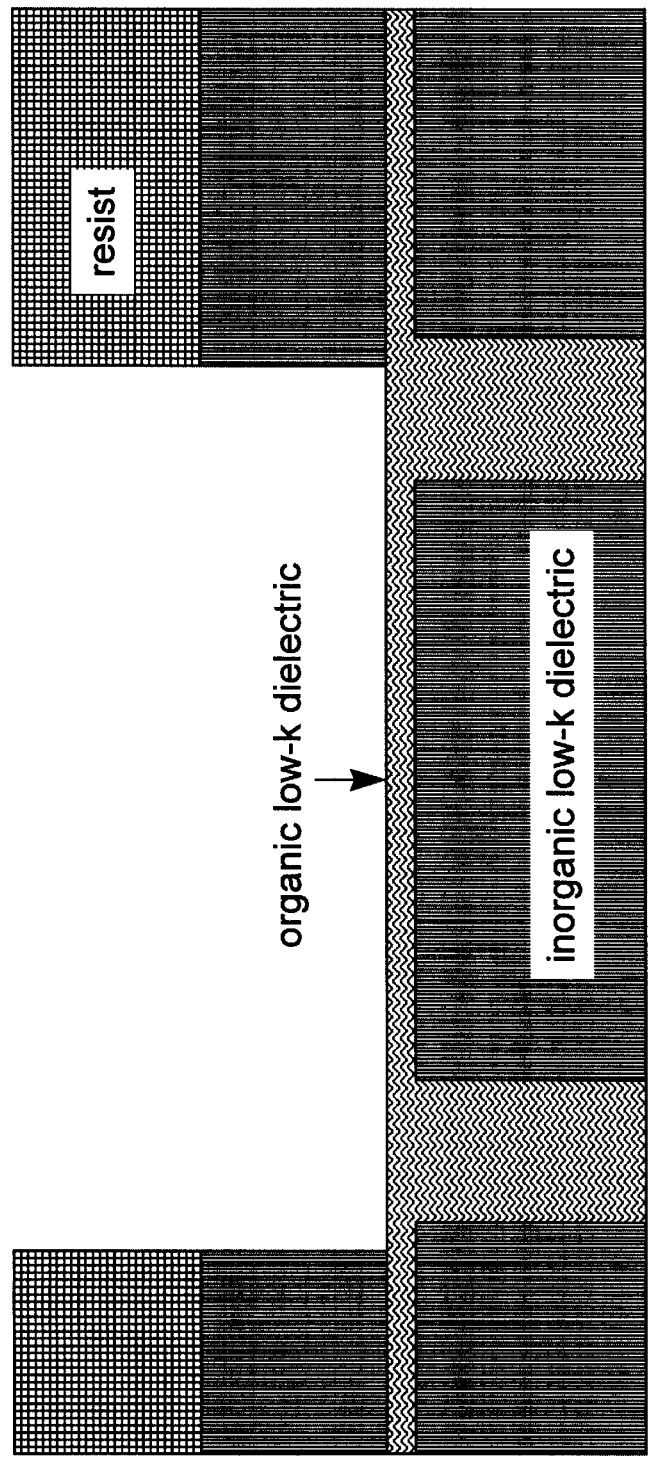
FIG. 3C shows result after inorganic low-k dielectric etch.
Figure 3D:
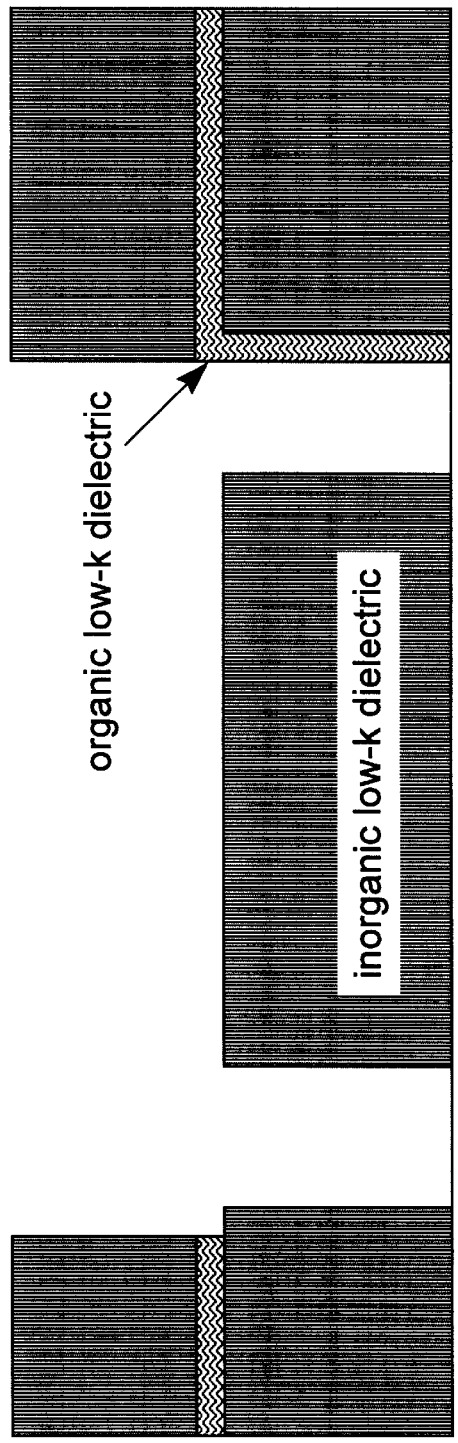
FIG. 3D shows result after organic low-k dielectric etch and resist removal.

A second process embodiment of the invention is represented by the process steps shown in FIGS. 3A through 3D. Again, the process flow covers from a first via level through an interconnect level, however, the same processing steps can be repeated again for upper levels of vias and interconnects. The same substrate, organic dielectric and inorganic dielectric materials may be used as in the first process embodiment described above. As shown in FIG. 3A, one begins with a substrate, which may comprises a pattern of metal lines on the substrate as with the embodiment described above. In step 1 one forms a first inorganic dielectric layer on a substrate and in step 2 one deposits a layer of a photoresist on the first dielectric layer. In step 3 there is an imagewise exposing of the resist through a via mask and removing a portion of the photoresist corresponding to at least one via for the first dielectric layer. In step 4 there is a similar removing the portion of the first dielectric layer under the removed portion of the photoresist thus forming at least one via through the first dielectric layer. In step 5 one then removing the balance of the photoresist layer; As shown in FIG. 3B, in step 6 a second dielectric layer is then formed on the first dielectric layer and in the at least one via. In step 7 an additional first dielectric layer is formed on second dielectric layer. In step 8 an additional layer of a photoresist is deposited on the additional first dielectric layer. Step 9 imagewise removes a portion of the additional photoresist corresponding to at least one trench for the additional first dielectric layer and the second dielectric layer. The result of steps 10 and 11 are shown in FIGS. 3C and 3D after sequentially removing the portions of the additional first dielectric layer and the second dielectric layer under the removed portion of the additional photoresist layer thus forming at least one trench through the additional first dielectric layer and the second dielectric. The balance of the additional photoresist layer is also removed at this time. Lining a barrier metal on inside walls and a floor of the trench and on inside walls and a floor the via and filling the trench and via with a fill metal in contact with the lining of the barrier metal as above produces the structure of FIG. 1. The process may be repeated for additional via and metal interconnect levels.

A third process embodiment of the invention is represented by the process steps shown in FIGS. 4A through 4E. The process flow shows the formation of the first via level and interconnect level, however, the same processing steps can be repeated again for upper levels of vias and interconnects.

Figure 4A:
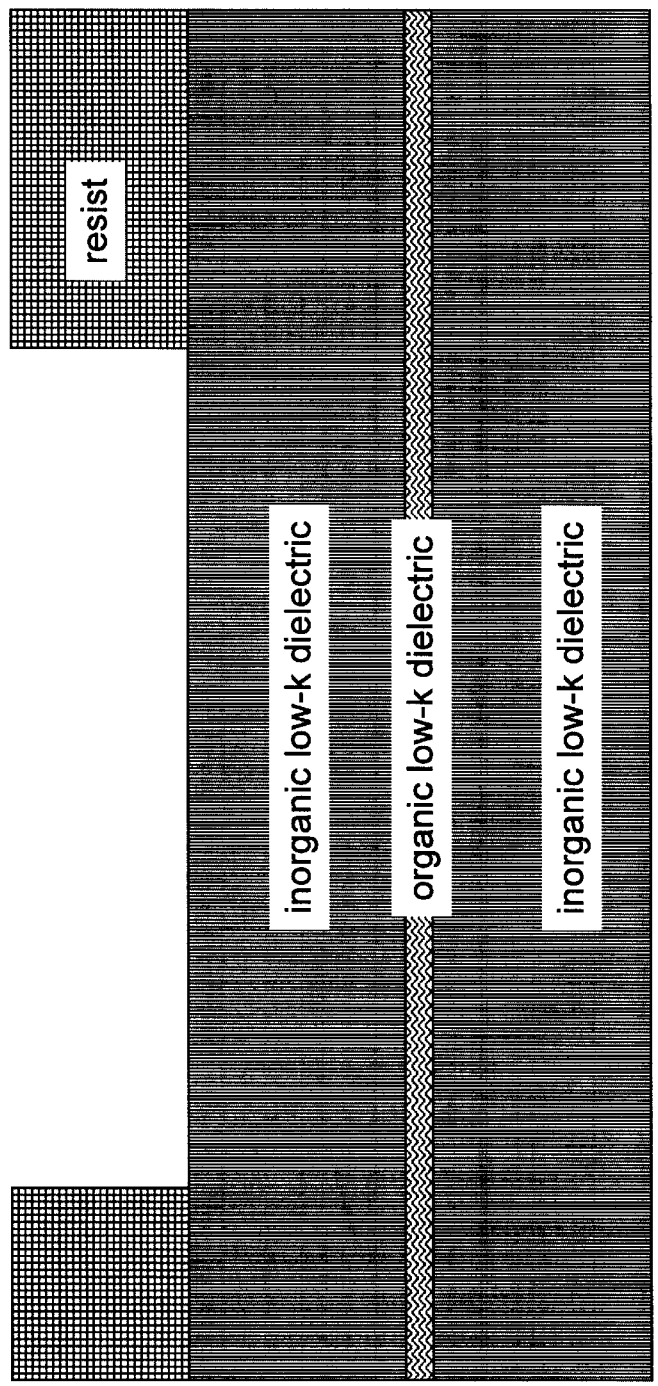
FIG. 4A shows a third microelectronic device formation process resulting after inorganic low-k dielectric deposition; organic low-k dielectric deposition; additional inorganic low-k dielectric deposition; resist spin and bake; and trench mask exposure and resist development.
Figure 4B:
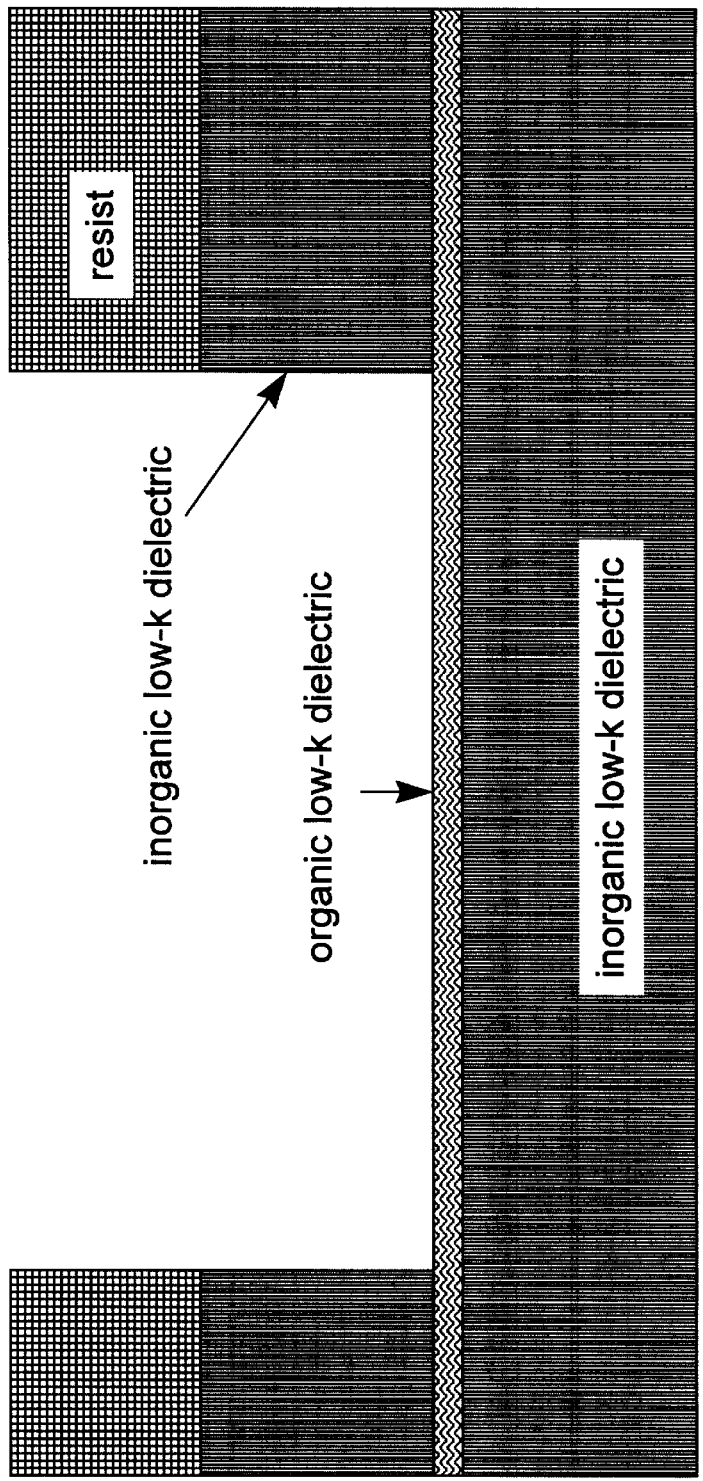
FIG. 4B shows the result after inorganic low-k dielectric etch.
Figure 4C:
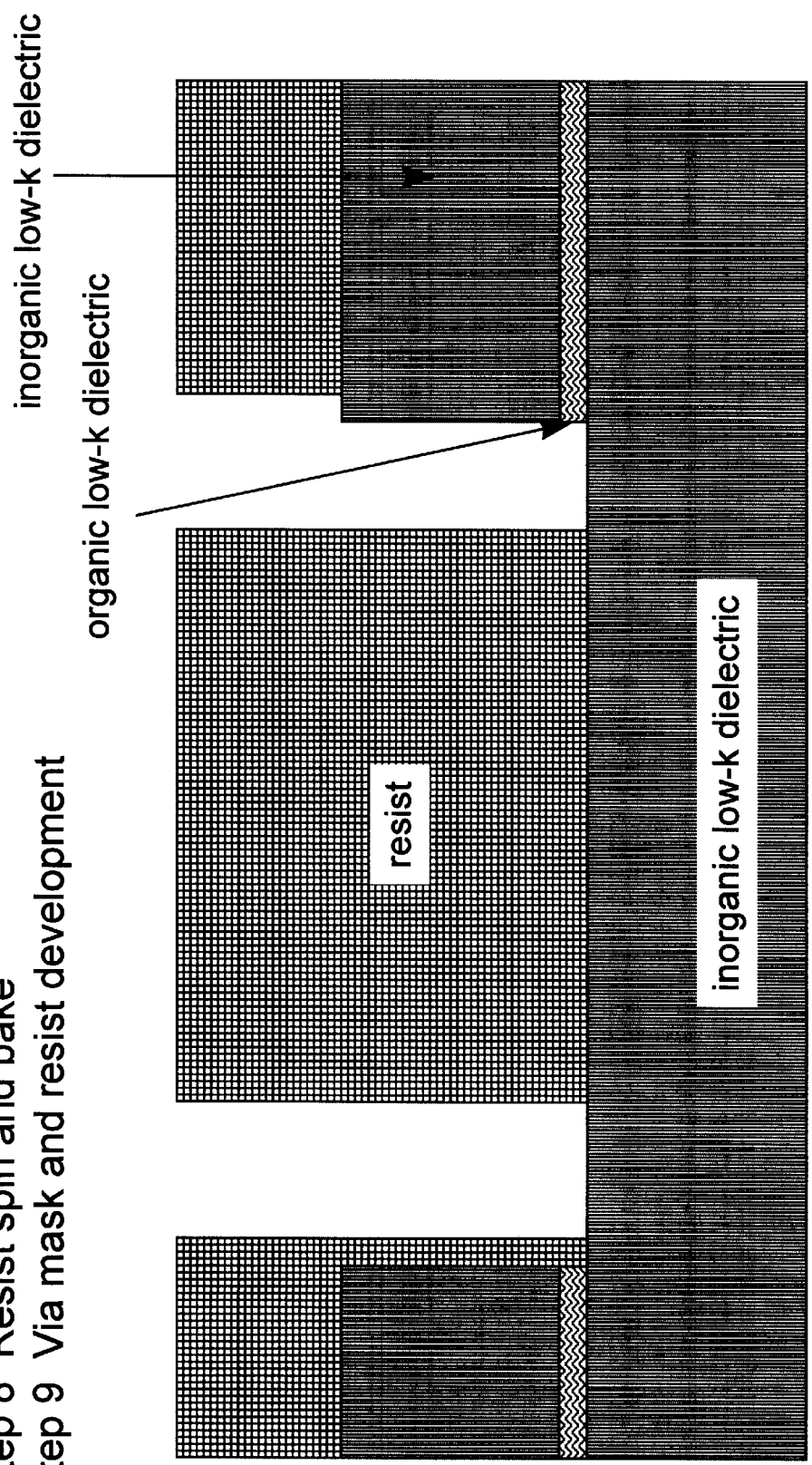
FIG. 4C shows the result after organic low-k dielectric etch and resist removal; resist spin and bake; and via mask exposure and resist development.
Figure 4D:
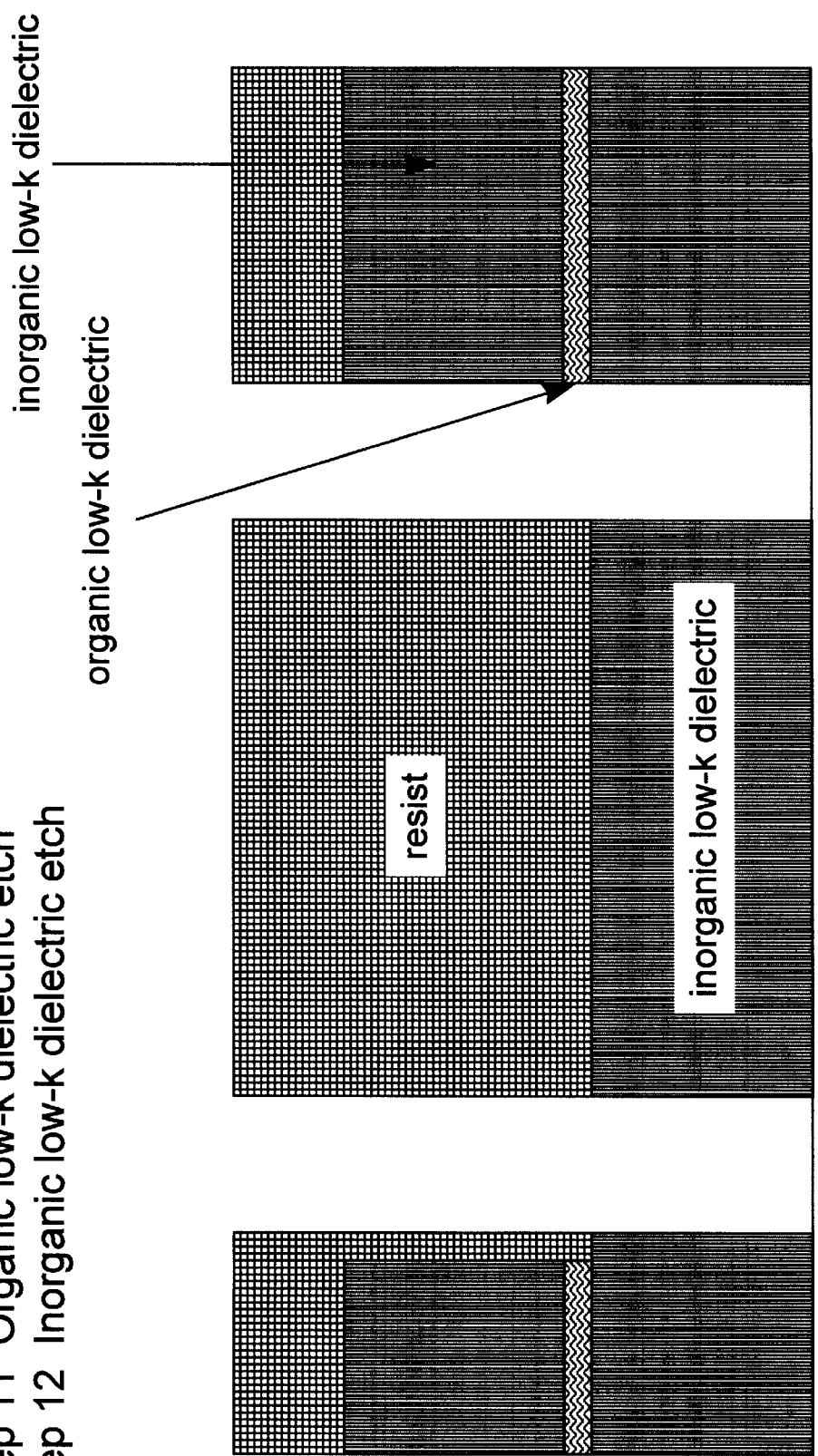
FIG. 4D shows result after inorganic low-k dielectric etch; organic low-k dielectric etch and inorganic low-k dielectric etch.
Figure 4E:
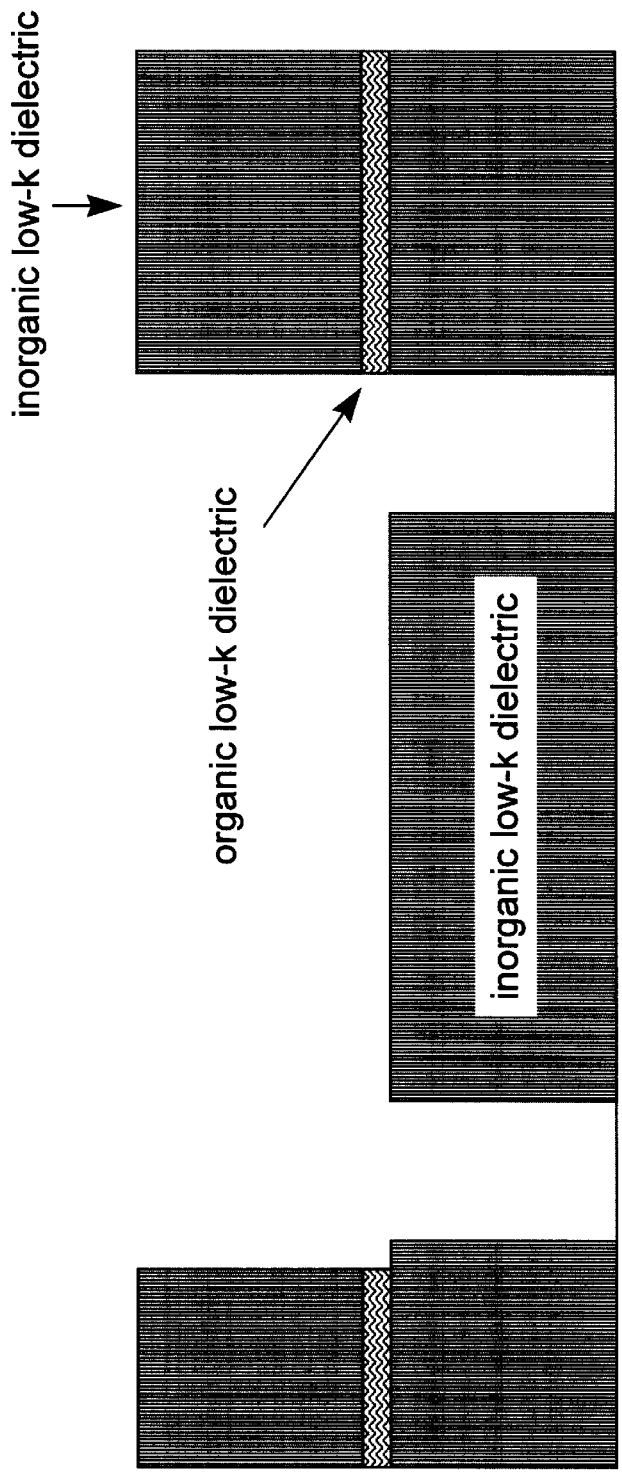
FIG. 4E shows result after resist removal.

FIG. 4A shows the interim structure after step 1 which is a deposition of a first inorganic low-k dielectric, step 2 which is a deposition of a second organic low-k dielectric on the first dielectric layer, step 3 which is a deposition of an additional layer of the first dielectric material positioned on the second dielectric material. Then in step 4 one deposits and bakes a layer of a photoresist on the additional first dielectric layer and in step 5 imagewise removes a portion of the photoresist corresponding to at least one trench for the additional first dielectric layer and the second dielectric layer. FIG. 4B shows the result after step 6 of removing the portions of the additional first dielectric layer under the removed portion of the photoresist. Step 7 etches the second dielectric layer under the removed portion of the photoresist thus forming at least one trench through the additional first dielectric layer and the second dielectric layer; and then removing the balance of the photoresist layer. Step 8: deposit an additional layer of a photoresist on the first dielectric layer and the additional first dielectric layer and step 9 imagewise exposes the additional layer of photoresist through a-via mask and removes a-portion of the additional photoresist corresponding to at least one via for the first dielectric layer. The result is seen in FIG. 4C. Step 10 removes the portion of the first dielectric layer under the removed portion of the additional photoresist layer thus forming at least one via through the first dielectric layer. Steps 111 and 12 are optional and may be employed to remove additional portions of the second organic dielectric layer and first inorganic dielectric layer as desired. The result is seen in FIG. 4D. FIG. 4E shows the result after step 13 of removing the balance of the additional photoresist layer. After filling the vias in the via level organic dielectric layer and the thin inorganic dielectric layer, and trenches in the organic dielectric etchstop layer and metal level inorganic dielectric layer with a metal the structure of FIG. 1 is obtained.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A microelectronic device which comprises
   (a) a substrate;
   (b) a layer of a first dielectric material positioned on the substrate;
   (c) a layer of a second dielectric material positioned on the first dielectric layer: wherein the first dielectric material and the second dielectric material have substantially different etch resistance properties;
   (d) an additional layer of the first dielectric material positioned on the second dielectric material;
   (e) at least one via extending through the first dielectric material layer and the second dielectric material layer and at least one trench through the additional layer of the first dielectric material extending to at least one via;
   (f) a lining of a barrier metal on inside walls and a floor of the trench and on inside walls and a floor of the via;
   (g) a fill metal filling the trench and via in contact with the lining of the barrier metal;
      wherein the first and second dielectric materials each comprise a material selected from the group consisting of a silicon containing polymer, an alkoxysilane polymer, a silsesguioxane polymer, a siloxane polymer, a poly(arylene ether), a fluorinated poly (arylene ether), a nanoporous silica and combinations thereof.

2. The microelectronic device of claim 1 which comprises a further layer of a first dielectric material on the additional layer of the first dielectric material and the fill metal; a further layer of a second dielectric material the additional layer of first dielectric material; another layer of a first dielectric material on the further layer of the second dielectric material; at least one additional via extending through the further layer of first dielectric material and the further layer of second dielectric material, and at least one additional trench through the another layer of the first dielectric material extending to the at least one additional via; a lining of a barrier metal on inside walls and a floor of the additional trench and on inside walls and a floor the additional via; a fill metal filling the additional trench and additional via in contact with the lining of the barrier metal.

3. The microelectronic device of claim 1 wherein the first dielectric material is inorganic and the second dielectric material is organic.

4. The microelectronic device of claim 1 wherein the fill metal is selected from the group consisting of aluminum, aluminum alloys, copper, copper alloys, tantalum, tungsten, titanium and mixtures thereof.

5. The microelectronic device of claim 1 wherein the substrate comprises gallium arsenide, germanium, silicon, silicon germanium, lithium niobate, compositions containing silicon or combinations thereof.

6. The microelectronic-device of claim 1 wherein the barrier metal comprises a material selected from the group consisting of titanium, titanium nitride, tantalum and tantalum nitride.

7. A process for producing a microelectronic device which comprises:
(a) forming a first dielectric layer on a substrate;
(b) forming a second dielectric layer on the first dielectric layer;
(c) forming an additional first dielectric layer on the second dielectric layer;
(d) depositing a layer of a photoresist on the additional first dielectric layer and imagewise removing a portion of the photoresist corresponding to at least one via for the first dielectric layer;
(e) sequentially removing the portions of the additional first dielectric layer, the second dielectric layer and the first dielectric layer under the removed portion of the photoresist thus forming at least one via through the first dielectric layer; and then removing the balance of the photoresist layer;
(f) depositing an additional layer ol a photoresist on the additional first dielectric layer and imagewise removing a portion of the additional photoresist corresponding to at least one trench for the additional first dielectric layer;
(g) removing the portion of the additional first dielectric layer under the removed portion of the additional photoresist layer thus forming at least one trench through the additional first dielectric layer;
(h) optionally removing the portion of the second dielectric layer under the removed portion of the additional photoresist layer;
(i) removing the balance of the additional photoresist layer;
(j) lining a barrier metal on inside walls and a floor of the trench and on inside walls and a floor of the via;
(k) filling the trench and via with a fill metal in contact with the lining of the barrier metal;
wherein the first and second dielectric each comprise a material selected from the group consisting of a silicon containing polymer, an alkoxysilane polymer, a silsesquioxane polymer, a siloxane polymer, a poly(arylene ether) a flourinated poly(arylene ether), a nanoporous silica and combinations thereof, and wherein the first dielectric and the second dielectric have substantially different etch resistance properties.

8. The process of claim 7 further comprising repeating step (a) through (k) at least once on the additional first dielectric layer and fill metal.

9. The process of claim 7 wherein the first dielectric material is inorganic and the second dielectric material is organic.

10. The process of claim 7 wherein the fill metal is selected from the group consisting of aluminum, aluminum alloys, copper, copper alloys, tantalum, tungsten, titanium and mixtures thereof.

11. The process of claim 7 wherein the substrate comprises gallium arsenide, germanium, silicon, silicon germanium, lithium niobate, compositions containing silicon or combinations thereof.

12. The process of claim 7 wherein the barrier metal comprises a material selected from the group consisting of titanium, titanium nitride, tantalum and tantalum nitride.

13. A process for producing a microelectronic device which comprises:
(a) forming a first dielectric layer on a substrate;
(b) depositing a layer of a photoresist on the first dielectric layer and imagewise removing a portion of the photoresist corresponding to at least one via for the first dielectric layer;
(c) removing the portion of the first dielectric layer under the removed portion of the photoresist thus forming at least one via through the first dielectric layer; and then removing the balance of the photoresist layer;
(d) forming a second dielectric layer on the first dielectric layer and in the at least one via;
(e) forming an additional first dielectric layer on second dielectric layer;
(f) depositing an additional layer of a photoresist on the additional first dielectric layer and imagewise removing a portion of the additional photoresist corresponding to at least one trench for the additional first dielectric layer and the second dielectric layer;
(g) sequentially removing the portions of the additional first dielectric layer and the second dielectric layer under the removed portion ol the additional photoresist layer thus forming at least one trench through the additional first dielectric layer and the second dielectric;
(h) removing the balance of the additional photoresist layer;
(i) lining a barrier metal on inside walls and a floor of the trench and on inside walls and a floor of the via;
(j) filling the trench and via with a fill metal in contact with the lining of the barrier metal;
wherein the first and second dielectric each comprise a material selected from the group consisting of a silicon containing polymer, an alkoxysilane polymer, a silsesquioxane polymer, a siloxane polymer, a poly(arylene ether), a fluorinated poly(arylene ether), a nanoporous silica and combinations thereof, and wherein the first dielectric and the second dielectric have substantially different etch resistance properties.

14. The process of claim 13 further comprising repeating step (a) through (j) at least once on the additional first dielectric layer and fill metal.

15. The process of claim 13 wherein the first dielectric material is inorganic and the second dielectric material is organic.

16. The process of claim 13 wherein the fill metal is selected from the group consisting of aluminum, aluminum alloys, copper, copper alloys, tantalum, tungsten, titanium and mixtures thereof.

17. The process of claim 13 wherein the substrate comprises gallium arsenide, germanium, silicon, silicon germanium, lithium niobate, compositions containing silicon or combinations thereof.

18. The process of claim 13 wherein the barrier metal comprises a material selected from the group consisting of titanium, titanium nitride, tantalum and tantalum nitride.

19. A process for producing a microelectronic device which comprises:

(a) forming a first dielectric layer on a substrate;

(b) forming a second dielectric layer on the first dielectric layer;

(c) forming an additional first dielectric layer on the second dielectric layer;

(d) depositing a layer of a photoresist on the additional first dielectric layer and imagewise removing a portion of the photoresist corresponding to at least one trench for the additional first dielectric layer and the second dielectric layer;

(e) sequentially removing the portions of the additional first dielectric layer and the second dielectric layer under the removed portion of the photoresist thus forming at least one trench through the additional first dielectric layer and the second dielectric layer; and then removing the balance of the photoresist layer;

(f) depositing an additional layer of a photoresist on the first dielectric layer and the additional first dielectric layer and imagewise removing a portion of the additional photoresist corresponding to at least one via for the first dielectric layer;

(g) removing the portion of the first dielectric layer under the removed portion of the additional photoresist layer thus forming at least one via through the first dielectric layer, optionally removing a portion of the additional first dielectric layer and the second dielectric layer under removed portions of the additional photoresist layer;

(h) removing the balance of the additional photoresist layer;

(i) lining a barrier metal on inside walls and a floor of the trench and on inside walls and a floor of the via;

(j) filling the trench and via with a fill metal in contact with the lining of the barrier metal;

wherein the first and second dielectric each comprise a material selected from the group consisting of a silicon containing polymer, an alkoxysilane Polymer, a silsesquioxane polymer, a siloxane polymer, a poly(arylene ether), a fluorinated poly (arylene ether), a nanoporous silica and combinations thereof, and wherein the first dielectric and the second dielectric have substantially different etch resistance properties.

20. The process of claim 19 further comprising repeating step (a) through (j) at least once on the additional first dielectric layer and fill metal.

21. The process of claim 19 wherein the first dielectric material is inorganic and the second dielectric material is organic.

22. The process of claim 19 wherein the fill metal is selected from the group consisting of aluminum, aluminum alloys, copper, copper alloys, tantalum, tungsten, titanium and mixtures thereof.

23. The process of claim 19 wherein the substrate comprises gallium arsenide, germanium, silicon, silicon germanium, lithium niobate, compositions containing silicon or combinations thereof.

24. The process of claim 19 wherein the barrier metal comprises a material selected from the group consisting of titanium, titanium nitride, tantalum and tantalum nitride.

* * * * *